US006376911B1

(12) United States Patent
Ryan et al.

(10) Patent No.: US 6,376,911 B1
(45) Date of Patent: *Apr. 23, 2002

(54) PLANARIZED FINAL PASSIVATION FOR SEMICONDUCTOR DEVICES

(75) Inventors: James Gardner Ryan, Newtown, CT (US); Alexander Mitwalsky; Katsuya Okumura, both of Poughkeepsie, NY (US)

(73) Assignees: International Business Machines Corporation, Armonk, NY (US); Siemens Aktiengesellschaft, Munich (DE); Toshiba Corporation, Kawasaki (JP)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/518,209

(22) Filed: Aug. 23, 1995

(51) Int. Cl.⁷ ................................................. H01L 23/48
(52) U.S. Cl. ...................... 257/752; 257/635; 257/640; 257/641; 257/649
(58) Field of Search ..................... 257/635, 640, 257/641, 644, 649, 639, 508, 751–2

(56) References Cited

U.S. PATENT DOCUMENTS

| | | | |
|---|---|---|---|
| 3,760,242 A | * 9/1973 | Duffy et al. | 257/640 |
| 3,838,442 A | * 9/1974 | Humphreys | 257/640 |
| 4,091,406 A | 5/1978 | Lewis | 257/640 |
| 4,091,407 A | 5/1978 | Williams et al. | 257/640 |
| 5,065,222 A | * 11/1991 | Ishii | 257/640 |
| 5,166,101 A | 11/1992 | Lee et al. | 437/238 |
| 5,268,330 A | 12/1993 | Givens et al. | 437/195 |
| 5,306,936 A | * 4/1994 | Goto | 257/640 |
| 5,312,512 A | 5/1994 | Allman et al. | |
| 5,354,387 A | 10/1994 | Lee et al. | 148/33.3 |
| 5,366,850 A | 11/1994 | Chen et al. | 430/314 |
| 5,393,708 A | 2/1995 | Hsia et al. | 437/228 |
| 5,451,804 A | * 9/1995 | Lur et al. | 257/330 |
| 5,459,345 A | * 10/1995 | Okudaira et al. | 257/310 |
| 5,510,652 A | * 4/1996 | Burke et al. | 257/752 |
| 5,530,280 A | * 6/1996 | White | 257/508 |
| 5,541,445 A | 7/1996 | Quellet | |
| 5,561,319 A | * 10/1996 | Owens et al. | 257/649 |
| 5,849,632 A | 12/1998 | Tuttle et al. | |

FOREIGN PATENT DOCUMENTS

| | | |
|---|---|---|
| DE | 4228529 | 3/1993 |
| JP | 62177927 | 8/1987 |
| JP | 3209823 | 9/1991 |

* cited by examiner

*Primary Examiner*—Roy Potter
(74) *Attorney, Agent, or Firm*—Alison D. Mortinger; Jay H. Anderson

(57) ABSTRACT

A final passivation structure for a semiconductor device having conductive lines formed on a surface of the semiconductor device, comprising a planarized layer covering the surface and also covering the conductive lines, and a diffusion barrier covering the planarized layer. Alternately, the planarized layer may partially cover the conductive lines.

5 Claims, 1 Drawing Sheet

PLANARIZED FINAL PASSIVATION FOR SEMICONDUCTOR DEVICES

FIELD OF THE INVENTION

This invention is directed to passivating structures for semiconductor devices, and more particularly to a dual layer final passivation.

BACKGROUND OF THE INVENTION

In the manufacture of semiconductor devices, a finished chip must be protected from environmental factors such as humidity, corrosion, and contaminants, as well as the stress of further assembly sc, that it will function properly. The process of forming a protective layer over the finished chip is called final (or secondary, or hard) passivation.

Prior art has attempted various means of final passivation, including hermetic metal and ceramic packages. More recently, a dual-layered structure deposited directly on the semiconductor device has been used, as described in U.S. Pat. No. 4,091,407 to Williams et al. Williams teaches the use of a first layer of glass, optionally followed by a second capping layer of undoped silicon dioxide, and finally a third layer of low temperature deposited nitride, preferably of the form $Si_WN_XH_YO_Z$ where w,x,y, and z are non-zero integers.

In Wiliams' case, and conventionally, the final passivation layer or layers are conformal (i.e. uniformly thick) over the wires (or lines) in the last layer of metallization (LLM). Because modern semiconductor devices have a topography mainly defined by the LLM, the final passivation must cover a step-like structure where typically vertical rises are at least 1 μm. Furthermore, as circuit density increases, advanced chip design requires very narrow spacing between LLM lines. Narrow spacing in combination with a steep topography present severe coverage problems for the final passivation layer.

FIG. 1 illustrates two such coverage problems. One is the presence of voids 103 in layer 101 between closely spaced LLMs 102 on substrate 100. The other is a thinning of layer 101 at the base of the vertical sidewall region shown at 105. This thinning is significant, and layer 101 has been observed to be 40% thinner at location 105 versus non-sidewall regions. These coverage problems result in structural defects which can cause incomplete final passivation of the chip, or other adverse effects.

In addition to the coverage issue, another problem occurs with the use of materials such as silicon nitride in a conformal final passivation layer. Silicon nitride has a high relative dielectric constant (∈) of about 7.0, and therefore high intralevel capacitance is a concern with silicon nitride filling a portion of the space between narrow LLM lines, as illustrated by layer 107 in FIG. 1. Note that an additional layer (not shown) such as polyimide can be formed over layer 107.

Thus, there remains a need for a passivation structure which provides complete chip coverage with a low intralevel capacitance for the! last level of metallization.

SUMMARY OF THE INVENTION

It is therefore an object of the present invention to provide a passivation structure that completely covers the chip with uniform thickness.

It is another object to provide a passivation structure with low intralevel capacitance.

In accordance with the above listed and other objects, a final passivation structure is provided for a semiconductor device having conductive lines formed on a surface of the semiconductor device, comprising a planarized layer covering the surface and also covering the conductive lines, and a diffusion barrier covering the planarized layer. Alternately, the planarized layer may partially cover the conductive lines.

BRIEF DESCRIPTION OF THE DRAWINGS

These and other features, aspects, and advantages will be more readily apparent and better understood from the following detailed description of the invention, in which.

DESCRIPTION OF THE PREFERRED EMBODIMENTS

Figure 1:
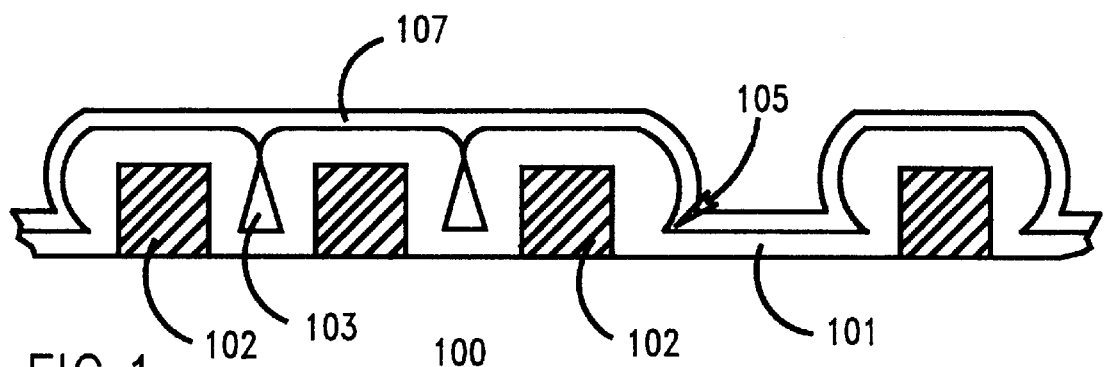
FIG. 1 is a sectional view of a prior art final passivation structure.
Figure 2:
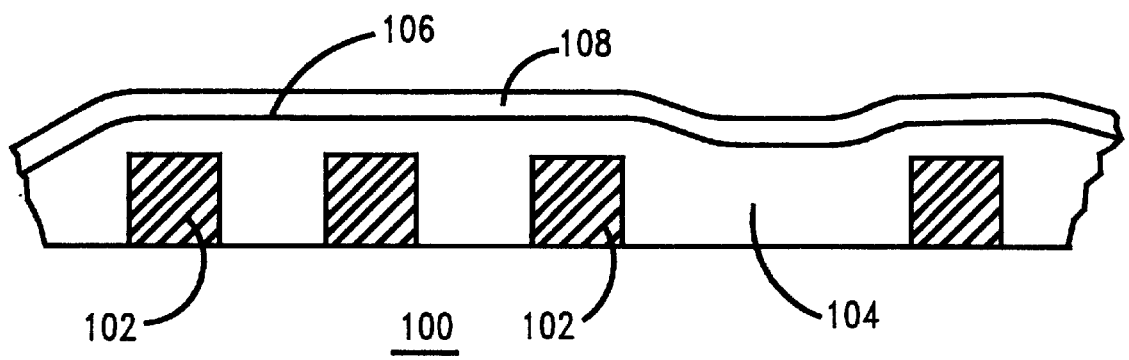
FIG. 2 is a sectional view of the dual layer final passivation structure in accordance with the present invention.

Referring now to the drawings and more particularly to FIG. 2, a dual layer passivation is shown. Conductive lines 102 in the last level of metallization (LLM) project from semiconductor chip 100. Note that chip 100 can contain more levels of metallization and insulating layers (i.e. more circuitry) below conductive lines 102, and an additional layer above layer 108 such as polyimide, for example (not shown).

A layer 104 is deposited over the surface of chip 100 and also over conductive lines 102 in order to form a planarized (i.e. "flattened" or "smoothed") surface 106. Layer 104 is a material that is locally self-planarizing and/or a layer that is deposited in a planarizing process. Examples of self-planarizing materials include but are not limited to: FLARE, spin-on glasses T-13 and T-14, the silsesquioxane class of materials including spin-on glass XT-15 (all made by Allied Signal); flowable oxide (FOx, made by Dow Corning); and inorganic spin-on glass perhydrosilazane (made by CCIC). These self-planarizing materials can be deposited for example by a spin-on process.

Planarizing processes for non-self-planarizing materials which offer either local or global planarization are well-known in the art and include spin-on plus either reflow or etchback, reflow oxide, and high pressure reflow, for example. With spin-on plus reflow, a chosen material is spun onto the wafer and then treated with heat to melt or reflow the material. Spin coating can alternately be followed by reactive ion etching, for example, back to a desired thickness in etchback processes. One example is using spin-on glass (SOG) to fill gaps in an oxide material such as $SiO_2$ deposited by plasma-enhanced chemical vapor deposition (PECVD), then using reactive ion etching (RIE) to etch the SOG back to the same height as the $SiO_2$. Care must be taken that the SOG and $SiO_2$ etch at roughly the same rate in order to achieve planarity. In so-called reflow oxide processes, an oxide is deposited and then reflowed to achieve planarization using either elevated temperature or high pressure or both.

Among all the alternative materials and methods for forming layer 104, $SiO_2$ deposited by a spin-on, CVD, PECVD, or high density plasma planarizing process is ideally suited for the present invention. $SiO_2$ is ideally suited because it: (1) is compatible with present semiconductor processes; (2) is cost. effective; and (3) has a relatively low dielectric constant. A material such as $SiO_2$ deposited using CVD or PECVD has a much lower dielectric constant (∈ of 3.7 to 4.5, depending on the source material, water content, doping elements present, etc.) compared to silicon nitride (∈ of about 7.0). Generally, replacing any higher dielectric constant material (such as silicon nitride) with a low dielectric constant material (such as silicon dioxide or a polymer) between lines 102 results in a desirable reduction of intralevel capacitance.

Once planarized layer 104 is formed, a diffusion barrier layer 108 is then deposited by conventional means on planarized or smoothed surface 106. Layer 108 is preferably a silicon nitride, and most preferably $SiN_xH_z$ or $SiN_xO_yH_z$ (where x, y, and z are >0) for their superior diffusion barrier capabilities against metallic contamination (such as alkali or transition metal ions) and humidity. However, any layer which functions as a barrier to penetration by contaminants will suffice.

Planarized surface 106 of layer 104 allows layer 108 to be uniformly thick and still provide complete coverage of the chip. A uniform thickness provides superior passivation as well as mechanical stability to the finished device. The resulting chip will then be more resistant to cracks in the passivation layer and is expected to have increased chip reliability in operation. The decrease in intralevel capacitance is expected to result in higher operational performance.

Figure 3:
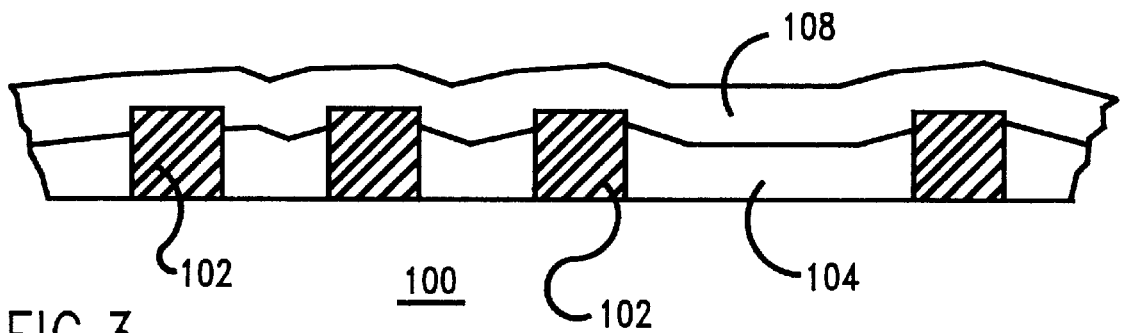
FIG. 3 is a sectional view of an alternate dual layer final passivation structure in accordance with the present invention.

FIG. 3 shows an alternate embodiment for the dual layer passivation structure. Here, layer 104 is thinner as compared to the structure in FIG. 2, and does not completely cover conductive lines 102. This may be desirable during via formation, as layer 108 is the only passivating layer that must be etched to reach lines 102. The tradeoff in etch simplicity is compensated by an increased intralevel capacitance as layer 108 is lower and partially fills between lines 102. Another concern is to ensure that enough of layer 104 is deposited between lines 102 to avoid gap formation.

In summary, a passivation layer has been described which provides complete chip coverage with a low intralevel capacitance for the last layer of metallization.

While the invention has been described in terms of specific embodiments, it is evident in view of the foregoing description that numerous alternatives, modifications and variations will be apparent to those skilled in the art. Thus, the invention is intended to encompass all such alternatives, modifications and variations which fall within the scope and spirit of the invention and the appended claims.

What is claimed is:

1. A final passivation structure for a semiconductor device having conductive lines formed on a surface of the semiconductor device, comprising:

a single planarized layer having a substantially planar top surface, covering the surface of the semiconductor device, and in contact with the conductive lines, such that the conductive lines project from the planarized layer, the planarized layer being self-planarizing; and a diffusion barrier covering the planarized layer and also covering the conductive lines, so that a top surface of the diffusion barrier is continuous over the surface of the semiconductor device, thereby forming said final passivation structure for the semiconductor device.

2. The structure of claim 1 wherein the self-planarizing layer is spin-on glass.

3. The structure of claim 1 wherein the diffusion barrier is resistant to contamination by metals.

4. The structure of claim 3 wherein the diffusion barrier is $SiN_xH_z$, where x and z are greater than zero.

5. A final passivation structure for a completed semiconductor device having conductive lines in a last level of metallization formed on a surface of the semiconductor device, comprising:

a single planarized layer having a substantially planar top surface, covering the surface of the completed semiconductor device, and in contact with the conductive lines, such that the conductive lines in the last level of metallization project from the planarized layer, the planarized layer being self-planarizing; and a diffusion barrier covering the planarized layer and also covering the conductive lines in the last level of metallization, so that a top surface of the diffusion barrier is continuous over the surface of the semiconductor device, thereby forming said final passivation structure for the completed semiconductor device.

* * * * *